(12) United States Patent
Achuthan et al.

(10) Patent No.: US 6,413,869 B1
(45) Date of Patent: Jul. 2, 2002

(54) DIELECTRIC PROTECTED CHEMICAL-MECHANICAL POLISHING IN INTEGRATED CIRCUIT INTERCONNECTS

(75) Inventors: Krishnashree Achuthan, San Ramon; Steven C. Avanzino, Cupertino; Kashmir S. Sahota, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/877,688

(22) Filed: Jun. 8, 2001

Related U.S. Application Data

(60) Provisional application No. 60/246,534, filed on Nov. 6, 2000.

(51) Int. Cl.[7] ..................... H01L 21/302; H01L 21/461
(52) U.S. Cl. ................... 438/690; 438/693; 438/692
(58) Field of Search ..................... 438/693, 692, 438/690; 257/773, 734, 522, 276

(56) References Cited

U.S. PATENT DOCUMENTS

| | | | | |
|---|---|---|---|---|
| 5,759,917 A | * | 6/1998 | Grover et al. | 106/11 |
| 5,783,489 A | * | 7/1998 | Kaufman et al. | 106/3 |
| 5,958,794 A | * | 9/1999 | Bruxvoort et al. | 216/88 |
| 6,083,840 A | * | 7/2000 | Mravic et al. | 216/89 |
| 6,117,783 A | * | 9/2000 | Small et al. | 106/3 |
| 6,147,002 A | * | 11/2000 | Kneer | 134/3 |
| 6,153,935 A | * | 11/2000 | Edelstein et al. | 257/276 |
| 2001/0005009 A1 | * | 6/2001 | Tsuchiya et al. | 252/79 |

* cited by examiner

Primary Examiner—Michael S. Lebentritt
(74) Attorney, Agent, or Firm—Mikio Ishimaru

(57) ABSTRACT

A method is provided for manufacturing an integrated circuit having a semiconductor substrate with a semiconductor device. A dielectric layer is formed on the semiconductor substrate and an opening is formed in the dielectric layer. A barrier layer is deposited to line the opening and conductor core is deposited to fill the channel opening over the barrier layer. By using a polishing solution having a dielectric protective characteristic, chemical-mechanical polishing of the conductor core and the barrier layer with the surface of the dielectric layer stops at the surface of the dielectric layer after planarization.

20 Claims, 3 Drawing Sheets

DIELECTRIC PROTECTED CHEMICAL-MECHANICAL POLISHING IN INTEGRATED CIRCUIT INTERCONNECTS

CROSS-REFERENCE TO RELATED APPLICATION

This application claims the benefit of U.S. Provisional patent application serial number 60/246,534 filed Nov. 6, 2000.

TECHNICAL FIELD

The present invention relates generally to semiconductor technology and more specifically to chemical-mechanical polishing in semiconductor processing.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts, extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings. The seed layer, generally of copper, is deposited to act as an electrode for the electroplating process.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and the "single" damascene process is completed. When additional layers of material are to be deposited for the dual damascene process, the capping layer also functions as an etch stop layer for a via formation step.

The via formation step of the dual damascene process continues with the deposition of a via dielectric layer over the first channels, the first channel dielectric layer, and the capping or via stop layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, which are deposited by electroplating, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to simultaneously form the vias and the second channels. When a layer is placed over the second channels as a final layer, it is called a "capping" layer and the "dual" damascene process is completed.

Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

One of the major problems encountered during the CMP process is that it actually requires two separate CMP steps. In the first step, the conductor material is subject to CMP using a first pad covered platen and a first slurry which is stopped at the barrier material. In the second step, the barrier material is subject to CMP using a second pad covered platen and a second slurry which is different from the first pad covered platen and the first slurry. The second step is supposed to stop at the dielectric layer, but extremely fine process control is required to do so. When the extremely fine process control fails, surface defects, erosion, and/or dishing of the channels and dielectrics occur. All of this makes it difficult to control the line thickness.

Solutions to these problems have been long sought but have long eluded those skilled in the art.

DISCLOSURE OF THE INVENTION

The present invention provides a method for manufacturing an integrated circuit having a semiconductor substrate with a semiconductor device. A dielectric layer is formed on the semiconductor substrate and an opening is form ed in the dielectric layer. A barrier layer is deposited to line the opening and conductor core is deposited to fill the channel opening over the barrier layer. By using a polishing solution having a dielectric protective characteristic, chemical-mechanical polishing of the conductor core and the barrier layer with the surface of the dielectric layer stops at the surface of the dielectric layer after planarization. Thus, a single step chemical-mechanical polishing process may be used without the dielectric layer or conductor core being subject to erosion even in maximum density interconnect structures. As a result, improved channel thickness control is achieved and the conductivity of the channel is improved.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
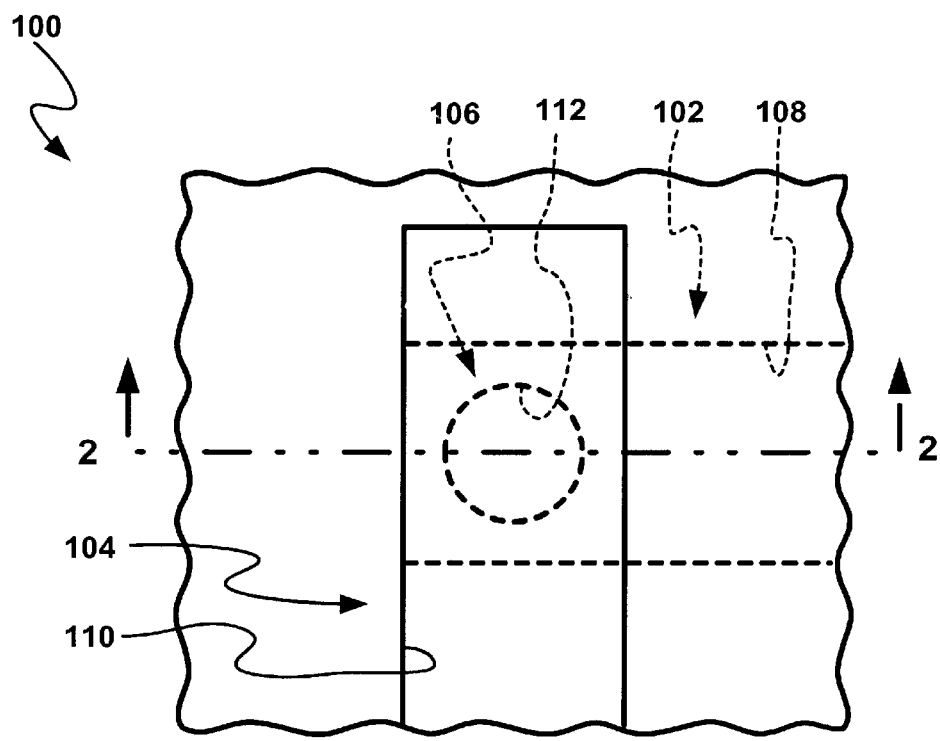
FIG. 1 (PRIOR ART) is a plan view of aligned channels with a connecting via.

Referring now to FIG. 1 (PRIOR ART), therein is shown a plan view of a semiconductor wafer 100 having as interconnects first and second channels 102 and 104 connected by a via 106. The first and second channels 102 and 104 are respectively disposed in first and second dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
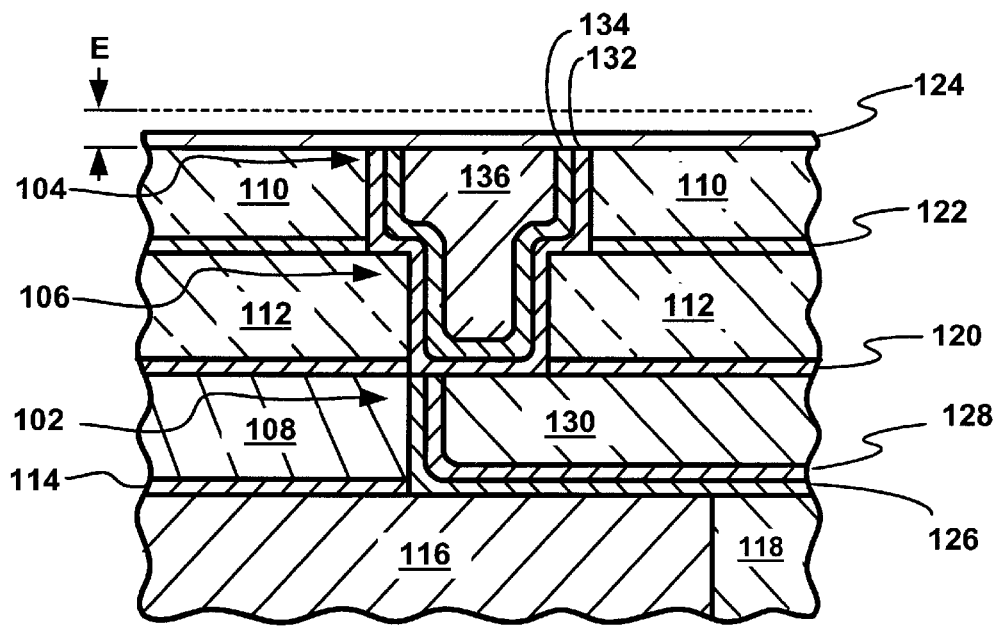
FIG. 2 (PRIOR ART) is a cross-section of FIG. 1 along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device.

The seed layers 128 and 134 form electrodes on which the conductor materials of the conductor cores 130 and 136 are deposited. The seed layers 128 and 134 are of substantially the same conductor material as the conductor cores 130 and 136 and become part of the respective conductor cores 130 and 136 after the deposition.

During the subsequent two-step CMP process, for example to form the second channel 204, when the barrier layer CMP is not tightly controlled, erosion "E" will occur.

Figure 3:
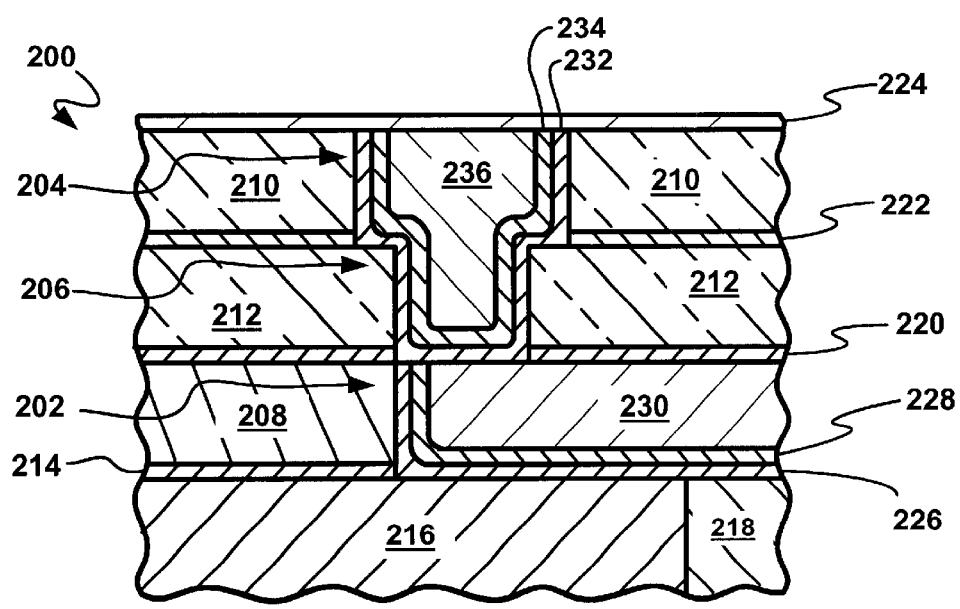
FIG. 3 is a cross-section similar to FIG. 2 (PRIOR ART) showing the reduced barrier layer thickness of the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor contact 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device.

The seed layers 228 and 234 form electrodes on which the conductor materials of the conductor cores 230 and 236 are deposited. The seed layers 228 and 234 are of substantially the same conductor material as the conductor cores 230 and 236 and become part of the respective conductor cores 230 and 236 after the deposition.

Due to the process of the present invention, the above structure is not subject to the erosion "E".

Figure 4:
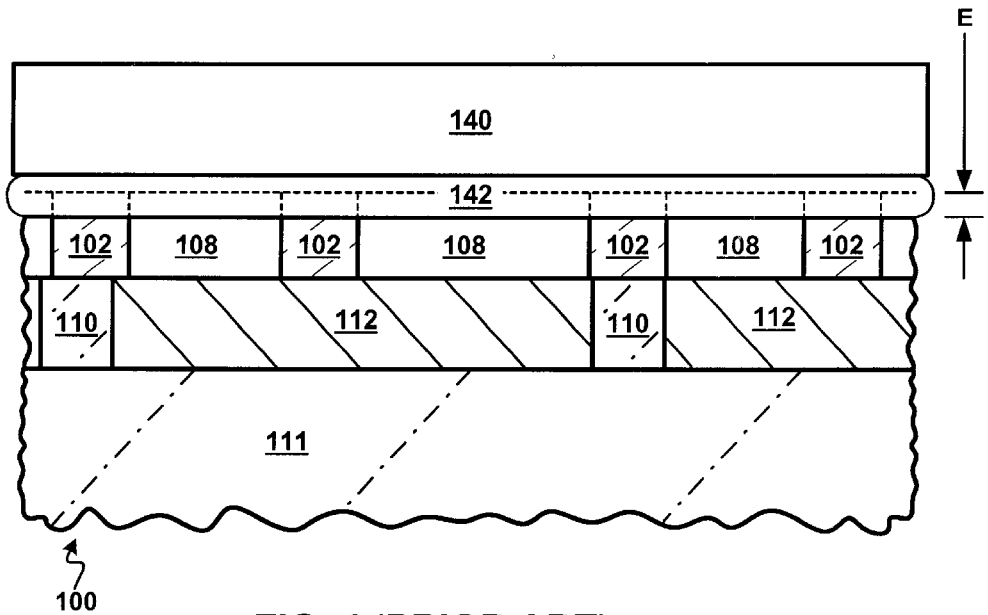
FIG. 4 (PRIOR ART) shows a step in the chemical-mechanical polishing process and depicts the conductor core and barrier layer erosion.

Referring now to FIG. 4 (PRIOR ART), therein is shown a second step in the CMP process in which a pad 140 is used to planarize a first channel surface of the semiconductor wafer 100. The first CMP, the conductor core CMP, has been completed and the second CMP, the barrier layer CMP, is shown being completed. Therein is thus shown the planarization of the first channels 102 and first channel dielectric layer 108. A conventional slurry 142 is used between the pad 140 and the wafer 100. There are a number of different slurries known which consist of sized abrasive particles carried by a CMP solution.

When the barrier layer CMP is not stopped soon enough, the barrier layer CMP solution will polish the dielectric material, such as silicon oxide, and cause the erosion "E". The erosion can dramatically change the thickness of the channels and reduce their current-carrying capability.

Figure 5:
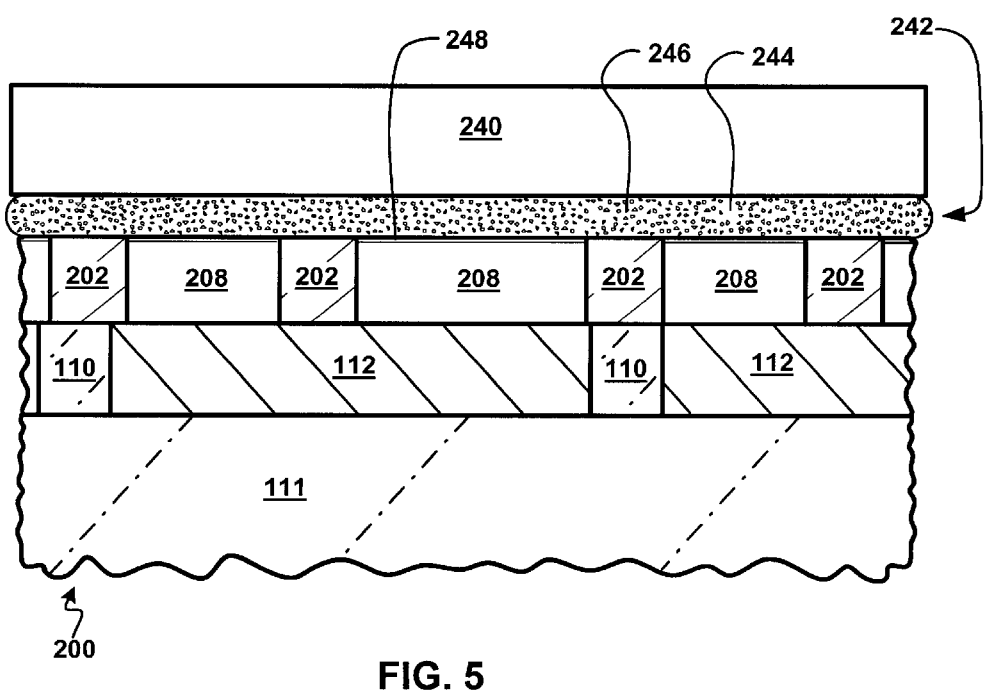
FIG. 5 shows a step in the chemical-mechanical polishing process of the present invention.

Referring now to FIG. 5, therein is shown the CMP step of the present invention in which a pad 240 works with a CMP slurry 242. The slurry 242 is made up of an organic CMP solution 244 in which a fine abrasive 246, generally of alumina, is suspended. The organic CMP solution 244 contains an organic chemical, such as a surfactant, which can be cationic, anionic, or non-ionic. As shown, once the barrier layer 226 is removed, the organic chemical 248 coats exposed areas of the dielectric layer 208 and protects the dielectric surface against further chemical polishing by changing the surface charge on the dielectric layer 208. For an oxide containing dielectric layer 208, the organic CMP solution 244 has an oxide-protecting characteristic. Different surfactants are well known and the specific surfactant is heuristically determined based on the dielectric material of the dielectric layer 208.

An example of an organic chemical 248, which is not a surfactant is benzene. An example of a cationic surfactant is dodecylpyridium chloride. An example of an anionic surfactant is glycolic acid ethoxylate lauryl ether. And an example of a non-ionic surfactant is polytheleneglycol. These examples are not intended to be limiting since many other examples are known to those skilled in the art.

The dielectric protected chemical-mechanical polishing eliminates the need for a thick barrier layer, prevents dishing, and eliminates the need to use a second barrier layer removal CMP or second slurry for barrier layer removal.

The organic chemical 248 is then removed using a water buff step or a scrub cleaning step.

As would be evident, each subsequent channel will be subject to the above process to form the integrated circuit interconnects.

In various embodiments, the barrier layers are of materials such as tantalum (Ta), titanium (Ti), tungsten (W), compounds thereof, and combinations thereof. The seed layers (where used) are of materials such as copper (Cu), gold (Au), silver (Ag), compounds thereof and combinations thereof with one or more of the above elements. The conductor cores with or without seed layers are of materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), etc. with dielectric constants below 3.9. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:
   providing a semiconductor substrate having a semiconductor device provided thereon;
   forming a dielectric layer on the semiconductor substrate;
   forming an opening in the dielectric layer;
   depositing a barrier layer to line the opening;
   depositing a conductor core over the barrier layer to fill the opening and connect to the semiconductor device; and
   chemical-mechanical polishing the conductor core and the barrier layer using a solution having a dielectric protecting characteristic of protecting the dielectric layer from chemical-mechanical polishing.

2. The method of manufacturing an integrated circuit as claimed in claim 1 wherein chemical-mechanical polishing uses an organic chemical having the dielectric protecting characteristic.

3. The method of manufacturing an integrated circuit as claimed in claim 1 wherein chemical-mechanical polishing uses a surfactant chemical having the dielectric protecting characteristic.

4. The method of manufacturing an integrated circuit as claimed in claim 1 wherein chemical-mechanical polishing uses a cationic surfactant chemical having the dielectric protecting characteristic.

5. The method of manufacturing an integrated circuit as claimed in claim 1 wherein chemical-mechanical polishing uses an anionic surfactant chemical having the dielectric protecting characteristic.

6. The method of manufacturing an integrated circuit as claimed in claim 1 wherein chemical-mechanical polishing uses a non-ionic surfactant chemical having the dielectric protecting characteristic.

7. The method of manufacturing an integrated circuit as claimed in claim 1 wherein chemical-mechanical polishing is performed in a single operation for both the conductor core and the barrier layer.

8. The method of manufacturing an integrated circuit as claimed in claim 1 including removing the solution from the dielectric layer after removal of the conductor core and the barrier layer over the dielectric layer.

9. The method of manufacturing an integrated circuit as claimed in claim 1 wherein depositing the barrier layer deposits a material selected from a group consisting of tantalum, titanium, tungsten, nitrides thereof, and a combination thereof.

10. The method of manufacturing an integrated circuit as claimed in claim 1 wherein depositing the conductor core deposits a metal selected from a group consisting of copper, copper-base alloys, aluminum, gold, gold-base alloys, silver, silver-base alloys, and a combination thereof.

11. A method of manufacturing an integrated circuit comprising:

providing a silicon substrate having a semiconductor device provided thereon;

forming an oxide layer on the semiconductor substrate;

forming an opening in the oxide layer;

depositing a barrier layer to line the opening;

depositing a conductor core over the barrier layer to fill the opening and connect to the semiconductor device; and chemical-mechanical polishing the conductor core using a solution having an oxide protecting characteristic of coating exposed oxide material to protect the oxide layer from chemical-mechanical polishing by changing the surface charge on the oxide layer; and removing the solution from the oxide layer after removal of the conductor core and the barrier layer over the oxide layer.

12. The method of manufacturing an integrated circuit as claimed in claim 11 wherein chemical-mechanical polishing uses an organic chemical having the oxide-protecting characteristic.

13. The method of manufacturing an integrated circuit as claimed in claim 11 wherein chemical-mechanical polishing uses a surfactant chemical having the oxide-protecting characteristic.

14. The method of manufacturing an integrated circuit as claimed in claim 11 wherein chemical-mechanical polishing uses a cationic surfactant chemical having the oxide-protecting characteristic.

15. The method of manufacturing an integrated circuit as claimed in claim 11 wherein chemical-mechanical polishing uses an anionic surfactant chemical having the oxide-protecting characteristic.

16. The method of manufacturing an integrated circuit as claimed in claim 11 wherein chemical-mechanical polishing uses a non-ionic surfactant chemical having the oxide-protecting characteristic.

17. The method of manufacturing an integrated circuit as claimed in claim 11 wherein chemical-mechanical polishing is performed in a single operation for both the conductor core and the barrier layer.

18. The method of manufacturing an integrated circuit as claimed in claim 11 including removing the solution from the dielectric layer after removal of the conductor core and the barrier layer over the dielectric layer by a process selected from a group consisting of water buff, scrub clean, and a combination thereof.

19. The method of manufacturing an integrated circuit as claimed in claim 11 wherein depositing the barrier layer deposits a material selected from a group consisting of tantalum, titanium, tungsten, nitrides thereof, and a combination thereof.

20. The method of manufacturing an integrated circuit as claimed in claim 11 wherein depositing the conductor core deposits a metal selected from a group consisting of copper, aluminum, gold, silver, an alloy thereof, and a compound thereof.

\* \* \* \* \*